US009315895B2

(12) United States Patent
Miyazawa et al.

(10) Patent No.: US 9,315,895 B2
(45) Date of Patent: Apr. 19, 2016

(54) APPARATUS FOR PRODUCING POLYCRYSTALLINE SILICON

(75) Inventors: Takashi Miyazawa, Hitachinaka (JP); Wataru Saiki, Hitachinaka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 716 days.

(21) Appl. No.: 13/067,015

(22) Filed: May 3, 2011

(65) Prior Publication Data

US 2011/0274851 A1   Nov. 10, 2011

(30) Foreign Application Priority Data

May 10, 2010   (JP) .................. 2010-108472

(51) Int. Cl.
*C23C 16/24* (2006.01)
*C23C 16/44* (2006.01)
*C01B 33/035* (2006.01)

(52) U.S. Cl.
CPC ............. *C23C 16/24* (2013.01); *C01B 33/035* (2013.01); *C23C 16/4411* (2013.01); *B01J 2219/00085* (2013.01); *B01J 2219/00094* (2013.01)

(58) Field of Classification Search
CPC .................. B01J 2219/00094; B01J 8/1809; B01J 2219/00085; B01J 2219/00164; B01J 3/02; B01J 3/048; B01J 4/00–4/008; C01B 33/02–33/035; C23C 14/541; C23C 16/00; C23C 16/0209; C23C 16/24; C23C 16/26; C23C 16/30; C23C 16/303; C23C 16/32; C23C 16/325; C23C 16/34; C23C 16/345; C23C 16/40; C23C 16/401; C23C 16/402; C23C 16/42; C23C 16/4411; C23C 16/4412; C23C 16/4418; C23C 16/455; C23C 16/45563; C23C 16/45578; C23C 16/458; C23C 16/4581; C23C 16/4587; C23C 16/46; C30B 25/00; C30B 25/02; C30B 25/08; C30B 25/10; C30B 28/00; C30B 28/12; C30B 28/14; C30B 35/00; H01J 37/32467; H01J 37/32477; H01J 37/32522; H01J 37/32798; H01J 37/32807; H01J 37/32889; Y10S 2209/918; Y10S 220/921; Y10T 117/10; F22B 35/02–35/04; F22B 35/06–35/16; F22B 37/36–37/365; F22B 37/70–37/74; G21C 1/08–1/09; G21C 1/18; G21D 3/12–3/14; G21D 5/12–5/16; G21Y 2004/302; Y02E 30/31–30/32
USPC ............. 118/715, 718, 723 R, 726, 730, 708, 118/724, 725; 156/345.1, 345.2, 345.27, 156/345.37
See application file for complete search history.

(56) References Cited

U.S. PATENT DOCUMENTS

| | | | |
|---|---|---|---|
| 3,142,584 A | 7/1964 | Reuschel et al. | |
| 3,180,802 A * | 4/1965 | West et al. | 376/371 |
| 3,284,312 A * | 11/1966 | West | 376/379 |
| 3,460,510 A * | 8/1969 | Currin | 118/720 |
| 3,545,410 A * | 12/1970 | Crisp et al. | 122/7 R |
| 3,685,508 A * | 8/1972 | Heilmann | 126/378.1 |
| 4,173,944 A * | 11/1979 | Koppl et al. | 118/719 |
| 4,250,840 A * | 2/1981 | Kudinov et al. | 122/6 A |
| 4,311,545 A * | 1/1982 | Bugl et al. | 117/102 |
| 4,539,016 A * | 9/1985 | Flockenhaus et al. | 48/197 R |
| 4,724,160 A * | 2/1988 | Arvidson et al. | 438/466 |
| 5,382,419 A * | 1/1995 | Nagai et al. | 118/719 |
| 5,584,971 A * | 12/1996 | Komino | 118/724 |
| 5,660,740 A * | 8/1997 | Komino | 118/724 |
| 5,975,335 A * | 11/1999 | Witenhafer | 220/592.05 |
| 2007/0248504 A1* | 10/2007 | Bindelle et al. | 422/131 |
| 2010/0080902 A1* | 4/2010 | Arifuddin et al. | 118/725 |
| 2011/0129621 A1* | 6/2011 | Qin | 427/585 |
| 2011/0212015 A1* | 9/2011 | Krishnan | 423/445 R |
| 2011/0318909 A1* | 12/2011 | Gum et al. | 118/724 |
| 2012/0039760 A1* | 2/2012 | Youn et al. | 422/198 |
| 2012/0237429 A1* | 9/2012 | Netsu et al. | 423/349 |

FOREIGN PATENT DOCUMENTS

| | | | |
|---|---|---|---|
| JP | 2009-173492 | 8/2009 | |
| WO | WO 2009120862 A2 * | 10/2009 | ............... C23C 16/24 |
| WO | WO 2010058408 A1 * | 5/2010 | ................. B01J 6/00 |
| WO | WO 2010107262 A2 * | 9/2010 | ............ C01B 33/107 |
| WO | WO 2011030492 A1 * | 3/2011 | |

OTHER PUBLICATIONS

M. F. McGuire, Stainless Steels for Design Engineers, ASM International Appendix 1 (2008) pp. 269 278.*

2004 ASME Boiler and Pressure Vessel Code 2004 Section II—Materials. American Society of Mechanical Engineers pp. 684 695.*

Chapters 5, 8 and 28 in "ICARUS Reference 3rd Edition." pp. 5-1 to 5-24; 8-1 to 8-16; & 28-1 to 28-56. Source location: ICARUS Corporation, 1998.*

\* cited by examiner

*Primary Examiner* — Parviz Hassanzadeh
*Assistant Examiner* — Stanislav Antolin
(74) *Attorney, Agent, or Firm* — Locke Lord LLP

(57) ABSTRACT

An apparatus for producing polycrystalline silicon having: a bell jar having a circumferential wall forming a chamber of a reactor and a jacket covering a circumferential wall, and in which a cooling path formed between the circumferential wall and the jacket that allows cooling medium including water to flow therethrough; a coolant feeding system which is connected to the bell jar so as to feed the cooling medium to the cooling path; a coolant recovering system which is connected to the bell jar so as to recover the cooling medium from the cooling path; a pressure control part controlling a pressure in the cooling path; and a flow-rate control part controlling a flow rate of the cooling medium, wherein the cooling medium flows in the cooling path as boiling two-phase flow by controlling the pressure and flow rate of the cooling medium.

7 Claims, 7 Drawing Sheets

APPARATUS FOR PRODUCING POLYCRYSTALLINE SILICON

BACKGROUND OF THE INVENTION

1. Field of the Invention

The present invention is relates to an apparatus for producing polycrystalline silicon producing rods of polycrystalline silicon by depositing polycrystalline silicon on a surface of heated silicon rod in a reactor.

Priority is claimed on Japanese Patent Application No. 2010-108472, filed on May 10, 2010, the content of which is incorporated herein by reference.

2. Description of the Related Art

A producing apparatus by the Siemens process is known as a producing apparatus of polycrystalline silicon. In the producing apparatus of polycrystalline silicon, a plurality of silicon seed rods are vertically set in a reactor and electric current is supplied to heat these rods. Raw gas including silicon compounds, such as chlorosilanes, and hydrogen is supplied into the reactor so as to bring the raw gas into contact with the heated silicon seed rods. As a result, polycrystalline silicon is deposited on the silicon seed rods by thermal decomposition reaction and the hydrogen reduction of the raw gas, so that the silicon seed rod grows into a rod-shape.

Conventionally, in the above-mentioned producing apparatus of polycrystalline silicon, a wall of the reactor used to be formed from quartz. However, as described in U.S. Pat. No. 4,311,545 and Japanese Unexamined Patent Application, First Publication No. 2009-173492, as the size of the apparatus is increased, the wall of the reactor is made from metallic materials such as stainless steel, nickel-base alloy or the like. Since the inner of the reactor is heated up to high temperature of around 1000° C. while producing polycrystalline silicon, in order to prevent contamination by impurity to polycrystalline silicon from the metallic materials, the temperature of the wall which is in contact with the atmosphere in the reactor should be kept lower than a certain restrictive temperature, for example, 300° C.

BRIEF SUMMARY OF THE INVENTION

Therefore, conventionally, the reactor wall is cooled by a water cooling jacket. As a result, large amount of heat is carried away by cooling water from a reactor. Also, the temperature of the cooling water is low, so that the heat recovered by the cooling water cannot be reused, and generally released from a cooling tower and the like to the environment. Therefore, it causes great loss of energy, and increases the cost of polycrystalline silicon and the environmental burden.

In U.S. Pat. No. 3,142,584, cooling medium having the higher boiling point (100° C. to 750° C.) than that of water is used for cooling the reactor, so as to cool a bottom plate of the reactor at high temperature and cool the cooling medium in an external heat exchanger. By this method, the bottom plate can be maintained at high temperature, so that the deposition of polymers (high-order chlorosilanes) on the bottom plate can be prevented. In this case, the temperature of the inner wall of the reactor may be increased, so that the impurity in produced polycrystalline silicon may be increased. However, no measure to prevent this problem is mentioned at all in this patent.

Furthermore, in order to reuse the exhaust heat by cooling medium, the heat should be recovered from the reactor by the cooling medium with high temperature. In this case, however, the temperature at the inner wall of the reactor becomes high, so that the purity of polycrystalline silicon is deteriorated. On the other hand, if sending down the temperature of the cooling medium in order to maintain the purity of polycrystalline silicon, the exhaust heat cannot be used because of its low temperature.

The present invention is achieved in consideration of the above circumstances, and has an object of providing an apparatus for producing polycrystalline silicon in which the exhaust heat can be recovered with useful high-temperature cooling medium and in which the impurity in polycrystalline silicon from the reactor wall can be restrained.

Means for Solving the Problem

According to the present invention, an apparatus for producing polycrystalline silicon in which raw gas including chlorosilanes is introduced into a reactor, in which electric current is supplied to silicon seed rods in the reactor so as to heat the silicon seed rods, and in which polycrystalline silicon is deposited on surfaces of the silicon seed rods and grown to rods, the apparatus has: a bell jar having a circumferential wall forming a chamber of the reactor and a jacket covering the circumferential wall, and in which a cooling path formed between the circumferential wall and the jacket that allows cooling medium including water to flow therethrough; a coolant feeding system which is connected to the bell jar so as to feed the cooling medium to the cooling path; a coolant recovering system which is connected to the bell jar so as to recover the cooling medium from the cooling path; a pressure control part controlling a pressure in the cooling path; and a flow-rate control part controlling a flow rate of the cooling medium, wherein the cooling medium flows in the cooling path as boiling two-phase flow by controlling the pressure and flow rate of the cooling medium.

It is necessary that the temperature of the cooling medium in the cooling jacket (the cooling path) be high enough to recover the exhaust heat, and that the temperature of the reactor be restrained to low at the inner surface of the circumferential wall (the reaction chamber side) in order to maintain the purity of the produced polycrystalline silicon. However, if single-phase flow of water is used as cooling medium, the difference between the main stream temperature of water and the temperature of the circumferential wall is broaden by the convection heat transfer of water. Therefore, if the inner surface temperature of the circumferential wall of the reactor is restrained below a certain prescribed temperature, it is limited to maintain high temperature of the cooling medium in the cooling jacket.

According to the apparatus for producing polycrystalline silicon of the present invention, since the circumferential wall of the reactor is cooled by the boiling two-phase flow of water and steam, it is possible to obtain a larger heat transfer coefficient of a boiling heat transfer than that of a single-phase flow of water. The difference between the main stream temperature of water (steam) and the temperature of outer of the circumferential wall of the reactor is inversely proportional to the heat transfer coefficient. Therefore, by using the boiling heat transfer, the temperature of the circumferential wall of the reactor can be decreased, and the exhaust heat can be recovered by high temperature steam, which is preferable state of recovered heat to be reused efficiently.

In the apparatus for producing polycrystalline silicon of the present invention, it is preferable that the apparatus further have a tank being connected to an upstream of the coolant feeding system and a downstream of the coolant recovering system; the cooling medium being recovered from the cooling path through the recovering system be separated into steam and liquid in the tank; and the separated liquid of the cooling medium be fed to the coolant feeding system from the tank. In this case, the cooling medium is circulated through the tank; and the gas phase of the cooling medium (i.e., steam) separated from the cooling medium in the tank can be supplied to external equipment in order to use the exhaust heat. Also, the liquid phase of the cooling medium can be supplied to the coolant feeding system. As a result, the reactor can be cooled while utilizing the exhaust heat efficiently as steam.

In the apparatus for producing polycrystalline silicon, it is preferable that the tank be provided at a position in which a liquid level in the tank higher than a top of the bell jar. By this construction, even though the pump or the like which circulate the cooling medium do not function, the cooling medium in the tank can be circulated through the coolant feeding system, the cooling path, and the coolant recovering system since the liquid level is high.

In the apparatus for producing polycrystalline silicon, it is preferable that the apparatus further have a pressure meter measuring an inner pressure of the tank; a supply system of steam having a steam-supply passage connected to the tank and a steam-supply valve which opens and closes the steam-supply passage, which draws out the steam in the tank; and a resupply system of cooling medium which resupplies the liquid of the cooling medium to the tank, wherein the pressure meter and the supply system of steam construct the pressure control part. In this case, the pressure in the cooling path can be controlled by using the function of separating steam from the cooling medium and feeding the steam to the external equipment. Also, liquid cooling medium corresponding to the weight of extracted steam can be resupplied.

In the apparatus for producing polycrystalline silicon of the present invention, it is preferable that: the coolant feeding system be connected to a plurality of coolant inlets that are provided on a lower part of the jacket with intervals along a circumferential direction so as to introduce the cooling medium to the cooling path; and the coolant recovering system be connected to a coolant outlet that is provided on an upper part of the jacket so as to discharge the cooling medium from the cooling path.

When cooling the circumferential wall of the reactor by boiling heat transfer, if the flow of the cooling medium in the jacket is not uniform, local dry out may occur. If dry out occurs, heat transfer coefficient rapidly decreases, so that the temperature of the circumferential wall of the reactor increases. As a result, impurities may occur from the circumferential wall.

In the apparatus for producing polycrystalline silicon according to the present invention, by providing the plurality of coolant inlets introducing the cooling medium on the lower part of the jacket, the cooling medium can flow uniformly from the lower part to the upper part in the jacket. Therefore, dry out can be prevented.

In the apparatus for producing polycrystalline silicon of the present invention, it is preferable that the apparatus further have partition plates that are provided between the circumferential wall and the jacket so as to divide at least a lower part of the cooling path to a plurality of cells adjacent along the circumferential direction, and the coolant inlets be connected to the cells.

By providing the partition plates to divide the inside of the jacket into the plurality of cells, the cooling medium can flow uniformly, so that dry out can be reliably prevented.

In this apparatus for producing polycrystalline silicon, it is preferable that the coolant feeding system also be connected to an additional plurality of upper coolant inlets that are provided on an upper part of the jacket with intervals along the circumferential direction so as to introduce the cooling medium to the cooling path. In this case, since the cooling medium can be directly supplied to the upper part of the circumferential wall at which dry out occurs easier than at the lower part, dry out can be prevented efficiently.

In the apparatus for producing polycrystalline silicon according to the present invention, it is preferable that the circumferential wall be formed from carbon steel, and have a covering layer on an inner surface, and the covering layer include one of or both a nickel layer and a stainless steel layer containing, by weight, 16 to 24% Cr, 8 to 15% Ni, and 0 to 5% Mo.

Generally, materials having high corrosion resistance, such as stainless steel, are used for the circumferential wall of the reactor. However, since the thermal conductivity of the stainless steel is low (about 16 W/(m·K)), in the process of transferring the heat from the reactor to the cooling medium, large temperature difference generates in the circumferential wall. On the other hand, if material having high thermal conductivity is used for the circumferential wall, temperature gradient in the circumferential wall can be restrained. However, if the material has low mechanical strength, necessary wall thickness has to be large for pressure resistance, so that the temperature difference in the circumferential wall cannot be decreased although using the material having high thermal conductivity.

In the apparatus for producing polycrystalline silicon of the present invention, since the circumferential wall is formed from carbon steel having high mechanical strength and high thermal conductivity, the temperature difference in the circumferential wall can be minimized, so that the inner surface temperature of the circumferential wall of the reactor can be low. As a result, the temperature of the cooling medium can be high. Furthermore, on the inner surface of the circumferential wall, the covering layer is provided so as to include the nickel layer or/and the stainless steel layer having high corrosion resistance, so that the corrosion resistance is improved. Therefore, with maintaining the temperature of the inner of the circumferential wall low as the impurities may not occur, the heat can be recovered with the high temperature cooling medium that is advantageous to use the exhaust heat.

Assuming that a certain value of heat flux is given from the inside of the reactor to the circumferential wall of the reactor and the exhaust heat is recovered at a certain value of saturated vapor pressure (or saturated temperature) in the cooling path, the inner surface temperature of the circumferential wall of the reactor can be decreased by carbon steel in comparison to the case of stainless steel, because carbon steel has larger thermal conductivity and larger mechanical strength than stainless steel. In other words, under a certain value of the inner surface temperature of circumferential wall and a certain value of heat flux, carbon steel has the advantage over stainless steel to obtain higher saturated pressure (or saturated temperature) of steam.

A method for producing polycrystalline silicon according to the present invention, introducing raw gas including chlorosilanes into a reactor, supplying electric current to silicon seed rods in the reactor so as to heat the silicon seed rods, and depositing polycrystalline silicon on surfaces of the silicon seed rods so as to grow to rods. The method has steps of: cooling a circumferential wall forming a chamber of the reactor by boiling two-phase flow including water and steam as a cooling medium so that temperature of the circumferential wall is lower than a prescribed restrictive temperature, and recovering the steam from the cooling medium while producing polycrystalline silicon.

Effects of the Invention

According to the apparatus for producing polycrystalline silicon of the present invention, by cooling the circumferential wall of the reactor with cooling medium of boiling two-phase flow of water and steam, the inner surface temperature of the circumferential wall of the reactor can be maintained low, so that contamination of the impurities to polycrystalline silicon can be prevented, and the heat can be recovered by high temperature steam, which is preferable state of recovered heat to be used efficiently. Furthermore, in a factory or the like where steam is in demand, heat recovered steam can be directly used, so that the exhaust heat can be recovered efficiently with decreasing thermal loss.

DETAILED DESCRIPTION OF THE INVENTION

Figure 1:
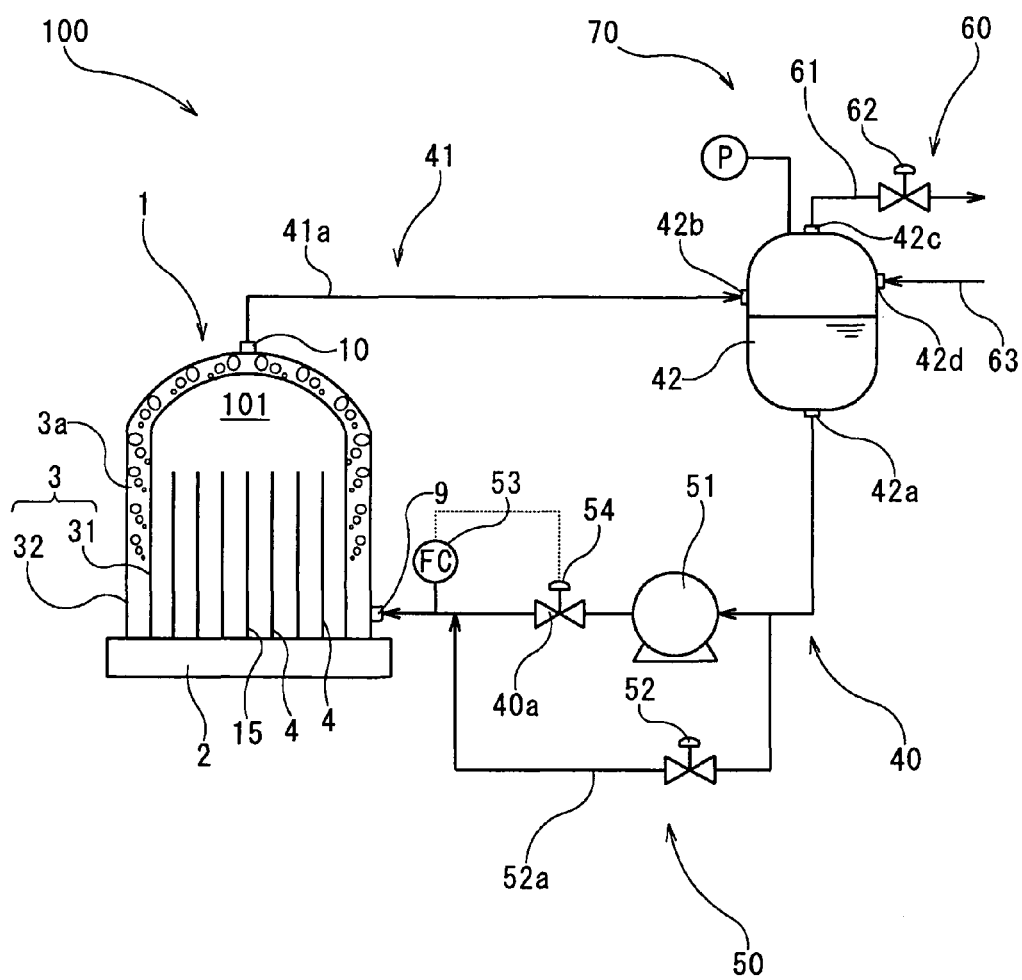
FIG. 1 is a schematic view showing the first embodiment of an apparatus for producing polycrystalline silicon of the present invention.

Hereinafter, an embodiment of an apparatus for producing polycrystalline silicon according to the present invention will be described with reference to the drawings.

An apparatus for producing polycrystalline silicon 100 of the present invention is provided with: a reactor 1 having a base 2 forming a reactor floor, and a bell jar 3 which is mounted on the base 2; a coolant feeding system 40 which is connected to the bell jar 3 and supplies cooling medium to a cooling path (space part) 3a of the reactor 1; a coolant recovering system 41 which is connected to the bell jar 3 and recovers the cooling medium from the cooling path 3a; a pressure control part 70 which controls a pressure in the cooling path 3a; and a flow-rate control part 50 which controls a flow rate of the cooling medium being supplied to the cooling path 3a. In the apparatus 100, the cooling medium can be circulated as boiling two-phase flow in the cooling path 3a by controlling the pressure and the flow rate of the cooling medium.

Figure 2:
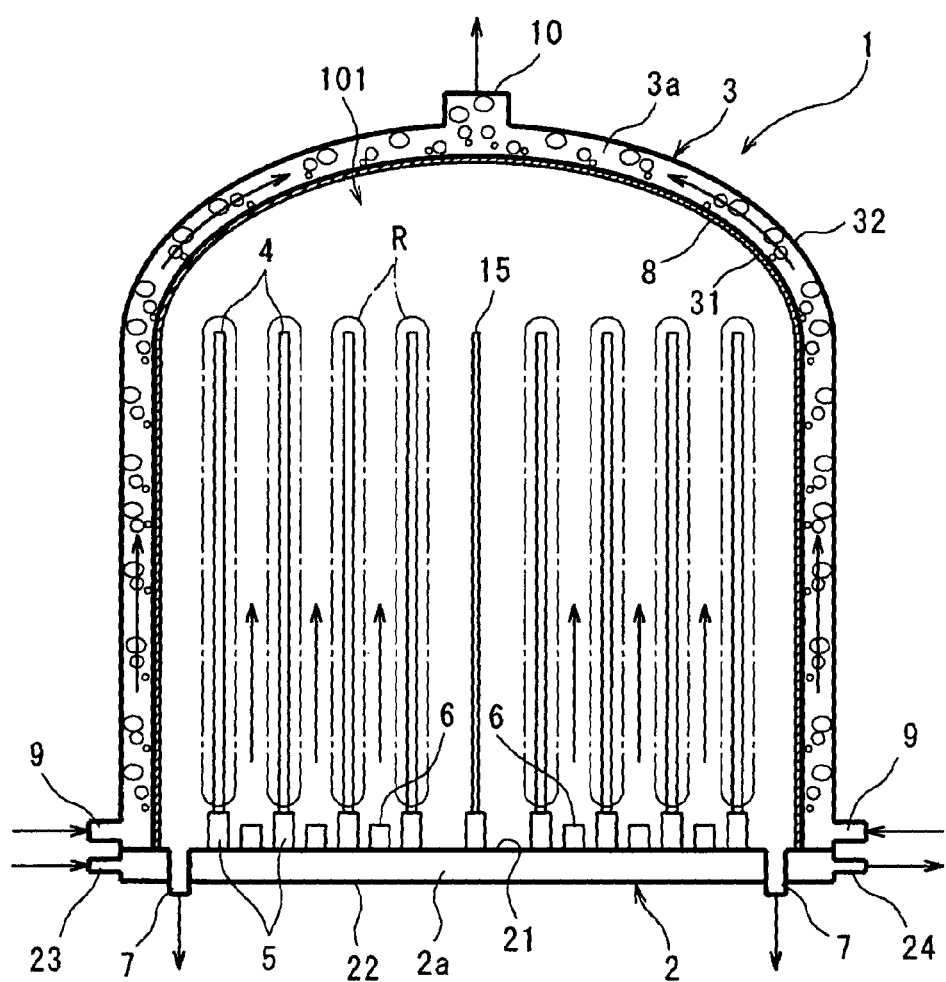
FIG. 2 is a longitudinal cross sectional view showing a reactor in the apparatus for producing polycrystalline silicon of FIG. 1.

As shown in FIG. 2, on the base 2, a plurality of electrodes 5 to which silicon seed rods 4 to be seeds for generating polycrystalline silicon rod are mounted, injection nozzles 6 which inject raw gas including chlorosilanes and hydrogen into the reactor 1, and gas exhaust ports 7 which discharge reacted gas to the outside of the reactor 1 are provided.

The electrodes 5 are formed from carbon to have substantially a columnar shape, mounted substantially concentrically on the base 2 with a regular intervals, stand perpendicularly to the base 2, and hold the silicon seed rods 4. The electrodes 5 are connected to an external power supply equipment of the reactor 1 (not illustrated), and supply the power to the silicon seed rods 4.

The silicon seed rods 4 are heated to about 1050° C. by the supplied power. When the raw gas which is introduced in the reactor 1 is in contact with the heated silicon seed rods 4 and thermally decomposed, polycrystalline silicon is deposited on surfaces of the silicon seed rods 4, so that polycrystalline silicon rods R are generated and grow to have a diameter of 10 cm or more.

The plurality of injection nozzles 6 of the raw gas are disposed apart with appropriate intervals on an entire surface of the base 2 of the reactor 1 so as to supply the raw gas uniformly to the silicon seed rods 4. The plurality of gas exhaust ports 7 are disposed apart with appropriate intervals on a peripheral part of the base 2.

At a center part of the reactor 1, a heater 15 made from carbon is mounted on the electrode 5 on the base 2 in a similar manner to the silicon seed rods 4. The heater 15 heats the silicon seed rods 4 in the vicinity of the center by radiation at the beginning of an operation.

An arrangement and a number of the silicon seed rods 4, and a position and a number of the injection nozzles 6 and the gas exhaust ports 7 can be appropriately set according to size of the reactor 1 or the like.

A cooling system for the reactor 1 in the apparatus 100 for producing polycrystalline silicon will be described. As shown in FIG. 2, in order to prevent heat damages, a double-walled cooling jacket structure is formed on the base 2 and the bell jar 3 of the reactor 1, so that the cooling medium can be circulated through inner space parts (the cooling paths) 2a and 3a. That is to say, the bell jar 3 has a circumferential wall 31 forming a reaction chamber 101 and an outer wall (a jacket) 32 covering the outer of the circumferential wall 31, so that the cooling path 3a through which the cooling medium is circulated is formed between the circumferential wall 31 and the outer wall 32. The space part 2a of the base 2 is formed between an upper wall 21 facing the inner space (the reaction chamber) 101 of the reactor and a lower wall 22 which is provided apart from the upper wall 21. The reference symbols 9 and 23 denote coolant inlets; and the reference symbols 10 and 24 denote coolant outlets.

In the apparatus 100 for producing polycrystalline silicon, a tank (a steam separator) 42 is provided. The tank 42 is connected to an upstream of the coolant feeding system 40 and a downstream of the coolant recovering system 41, separates steam from the cooling medium which is recovered from the cooling path 3a via the coolant recovering system 41, and supplies liquid separated from the cooling medium to the coolant feeding system 40. That is to say, the cooling system for the reactor 1 (i.e., the bell jar 3) is constructed from the tank 42, the coolant feeding system 40, the coolant recovering system 41, and the cooling path 3a of the bell jar 3.

The coolant feeding system 40 is provided with: a coolant feeding path 40a in which the cooling medium flows; the flow-rate control part 50 provided in the coolant feeding path 40a, which sends the cooling medium with controlling the flow rate thereof to the cooling path 3a of the bell jar 3; a bypass passage 52a which is formed in parallel to the coolant feeding path 40a; and a valve 52 which opens and closes the bypass passage 52a. The coolant feeding path 40a is connected at the upstream thereof to a supplying port 42a provided at the lower part of the tank 42, and connected at the downstream thereof to the coolant inlets 9 provided at the lower part of the bell jar 3.

The flow-rate control part 50 is provided with: a pump 51 which sends the cooling medium in the coolant feeding path 40a; a flow-meter 53 provided at the downstream after the pump 51, which measures the flow rate of the cooling medium; and a flow-rate control valve 54 provided between the pump 51 and the flow-meter 53, which controls the flow rate of the cooling medium to the cooling path 3a. In the flow-rate control part 50, by measuring the flow rate of the cooling medium sent by the pump 51 by the flow-meter 53, and controlling the flow-rate control valve 54 in accordance with the signal from the flow-meter 53, the flow rate of the cooling medium can be controlled.

The tank 42 is arranged so that a liquid level of the cooling medium stored therein is positioned higher than the coolant outlet 10 of the bell jar 3. Therefore, by opening the valve 52, although the pump 51 cannot be functioned in the coolant feeding system 40, the cooling medium can be circulated through the bypass passage 52a, so that the reactor 1 can be prevented from being heated excessively.

The coolant recovering system 41 has a coolant recovering path 41a which is connected at the upstream thereof to the coolant outlet 10 provided at the upper part of the bell jar 3, and connected at the downstream thereof to a coolant recovering port 42b provided at the tank 42.

The tank 42 is provided with: the supplying port 42a for supplying the cooling medium and the coolant recovering port 42b for recovering the cooling medium; a steam supplying port 42c to which a steam supplying system 60 is connected in order to supply steam in the tank 42 to an external equipment (not illustrated) for using the exhaust heat; and a coolant resupplying port 42d to which a coolant resupplying system 63 is connected for resupplying the liquid cooling medium into the tank 42.

The steam supplying system 60 which is connected to the steam supplying port 42c has: a steam supplying path 61 connected to the tank 42; and a steam supplying valve 62 which opens and closes the steam supplying path 61. The steam supplying system 60 draws the steam from the tank 42, and supplies the steam to external equipment (not illustrated) which uses the exhaust heat recovered from the reactor 1.

A pressure meter P measuring an inner pressure of the tank 42 is provided at the tank 42. Since the inside of the tank 42 is connected to the cooling path 3a through the coolant recovering path 41a, by opening and closing the steam supplying valve 62 in accordance with a measured result of the pressure meter P, the inner pressure of the tank 42, i.e., the pressure of the cooling path 3a can be controlled. That is to say, the pressure meter P and the steam supplying system 60 (i.e., the steam supplying path 61 and the steam supplying valve 62) construct the pressure control part 70 in the apparatus 100 for producing polycrystalline silicon.

The coolant resupplying port 42d of the tank 42 is connected to the coolant resupplying system (the coolant resupplying path) 63 resupplying the liquid cooling medium to the tank 42. From the coolant resupplying path 63, a cooling medium, which is condensed after being used at the external equipment to which the exhaust heat has supplied through the steam supplying system 60, and an additional cooling medium are resupplied into the tank 42.

The circumferential wall 31 of the reactor 1 is formed from carbon steel (a carbon steel layer 8A) having thermal conductivity of 35 W/(m·K) or more, and has a covering layer 8B provided on the inner surface in order to have corrosion resistance. The covering layer 8B includes one of or both a nickel layer or a stainless layer containing, by weight, 16 to 24% Cr, 8 to 15% Ni, and 0 to 5% Mo, and formed on the base wall of carbon steel by plating, thermal spraying, or the like. The circumferential wall 31 in the apparatus 100 for producing polycrystalline silicon of the present embodiment is formed from a clad material in which the covering layer 8B made from nickel is attached on a surface of the carbon steel layer 8A.

Figure 3:
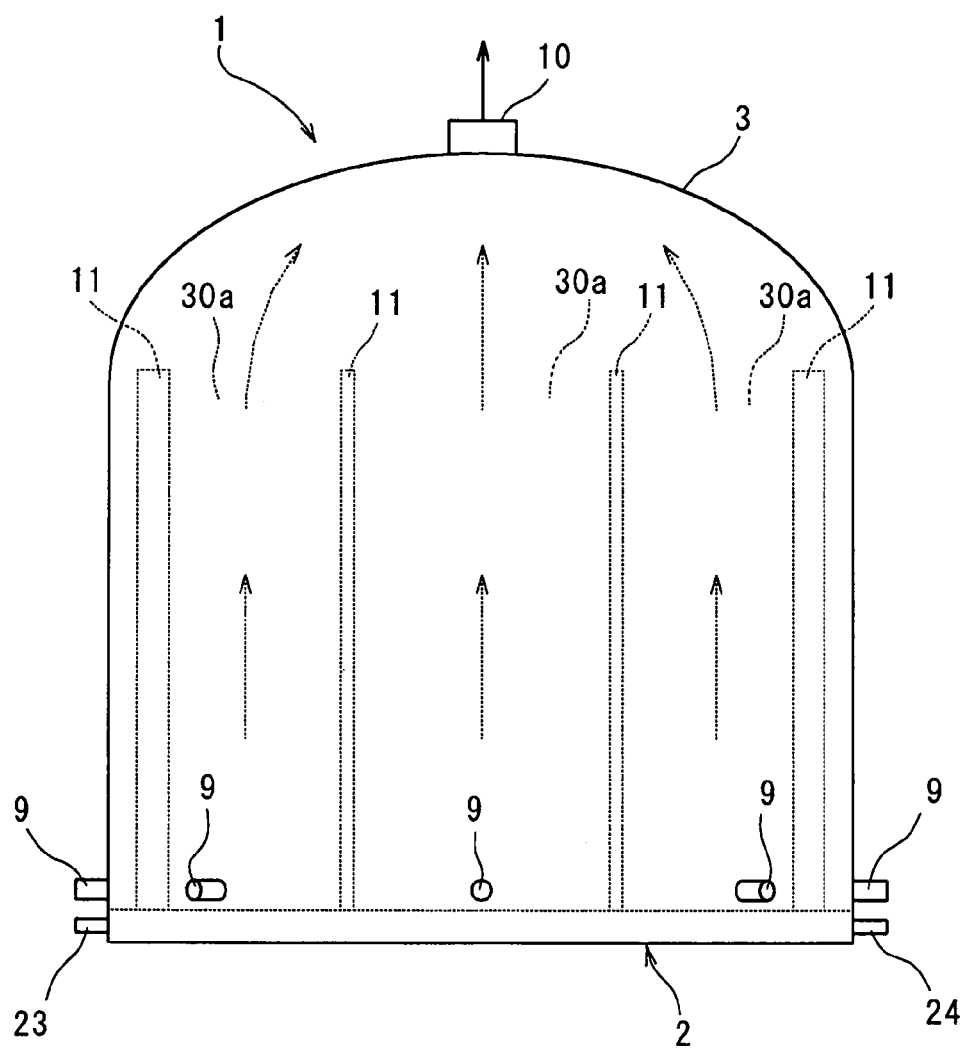
FIG. 3 is an external view showing the reactor of FIG. 1.

As shown in FIGS. 2 and 3, the plurality of coolant inlets 9 which introduces the cooling medium to the cooling path 3a is provided at the lower part of the outer wall 32 of the reactor 1 with intervals along the circumferential direction. Between the circumferential wall 31 and the outer wall 32, a plurality of partition plates 11 which divide at least the lower part of the cooling path 3a to a plurality of cells 30a adjacent along the circumferential direction. At the top of the outer wall 32, the coolant outlet 10 which discharges the cooling medium from the cooling path 3a is provided. The coolant inlets 9 are connected to the coolant supplying system 40; and the coolant outlet 10 is connected to the coolant recovering system 41. The flow of the cooling medium supplied to the cooling path 3a through each coolant inlet 9 joins near the top of the bell jar 3 via each cell 30, and the cooling medium is discharged to the coolant recovering system 41 through the coolant outlet 10 provided at the top of the bell jar 3.

In the apparatus 100 for producing polycrystalline silicon as described above, water as the cooling medium becomes boiling two-phase flow of water and steam by being maintained high pressure (for example, 0.15 MPa for the present embodiment) in the cooling system and by being heated in the cooling path 3a of the bell jar 3. That is to say, the cooling medium is introduced in a state of liquid having nearly saturated temperature (127° C. at 0.15 MPa), so that it cools the circumferential wall 31 facing the inside of the reactor 1 and is heated while flowing through the cooling path 3a; as a result, the cooling medium becomes boiling two-phase flow of water and steam.

The temperature of the cooling medium is maintained constant (as the saturated temperature) and high enough to be reused efficiently. On the other hand, the inner surface temperature of the circumferential wall 31 facing the inner space 101 of the reactor 1 can be maintained to a restrictive temperature, for example, as low as 300° C. or lower. After discharging the boiling two-phase flow from the coolant outlet 10, the steam separated from the cooling medium at the steam separator (the tank) 40 is sent to another process in which the steam is used, thereby the exhaust heat can be used efficiently. In the base 2, liquid cooling medium (i.e., water) is supplied from a supplying system other than the coolant supplying system 40 to the space part 2a through the coolant inlets 23, and discharged through the coolant outlet 24, so that the base 2 is cooled.

The boiling state of the cooling medium in the cooling path 3a changes in accordance with the flow rate of the cooling medium (cooling water) and the heat transmission through the circumferential wall 31. The heat transmission changes with time in accordance with a growth state of polycrystalline silicon, flow rates of the raw gas supplied to the reactor 1 such as chlorosilane or hydrogen, or the like. Therefore, by controlling the flow rate of the cooling water using the pump 51, the boiling state of the cooling medium in the cooling path 3a can be controlled. Though the flow rate of the cooling water can be changed along corresponding to the change of the heat transmission, it is easy to control if the flow rate is constant. In a case in which the flow rate of the cooling water is set constant, a weight ratio of steam in the boiling two-phase flow (i.e., a quality) at an exit (the coolant outlet 10) of the cooling path 3a changes with time. Preferable extent of the quality is 0.5% to 20%.

If the maximum value of the quality is less than 0.5%, the flow rate of the cooling water necessary to be supplied to the cooling path 3a is increased, the pump 51 supplying the cooling water and the steam separator (the tank) 42 separating the steam from the boiling two-phase flow are too large, so that the heat loss is increased; and the heat recovery efficiency is deteriorated. On the other hand, if the maximum value of the quality is greater than 20%, the volume ratio of the steam in the boiling two-phase flow is too large. As a result, dry out may occur at a part of the circumferential wall 31 of the reactor 1, so that the temperature of the wall may unfavorably increase partially.

More preferable extent of the maximum value of the quality is 1% to 10%. By controlling the flow rate of the cooling water in order to obtain the quality in this extent, unnecessarily large cooling equipments are not needed, and the circumferential wall 31 can be cooled by stable boiling two-phase flow.

Figure 4:
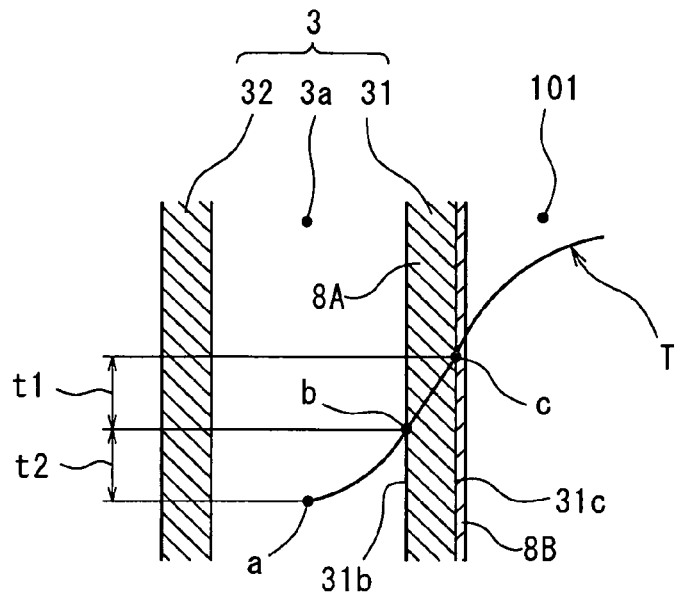
FIG. 4 is an explanation drawing showing temperature gradient of the reactor.

FIG. 4 shows the temperature gradient in the inner space 101 and the bell jar 3 of the reactor 1. A curved line T shows temperature gradient from the inner space 101 of the reactor 1 toward the space part 3a in the bell jar 3 through which the cooling medium flows. A point "a" denotes temperature of the cooling medium flowing in the space part 3a, a point "b" denotes temperature at a surface 31b toward the space part 3a, of the carbon steel layer 8A forming the circumferential wall 31, and a point "c" denotes temperature at an interface 31c between the carbon steel layer 8A and the covering layer 8B in the circumferential wall 31.

In the apparatus 100 for producing polycrystalline silicon of the present embodiment, by forming the circumferential wall 31 from carbon steel having high mechanical strength and thermal conductivity of 35 W/(m·K) or more, temperature difference (denoted as t1 in FIG. 4) in the circumferential wall 31 (the carbon steel layer 8A) can be so small that the temperature of the covering layer 8B is low. As a result, the inner surface temperature of the circumferential wall 31 is low, and the cooling medium temperature is high enough to be reused efficiently. In this case, in order to maintain the inner surface temperature of the circumferential wall 31 low, a thickness of the covering layer 8B may be set to 0.5 mm to 5 mm.

That is to say, as shown in FIG. 4, in the carbon steel layer 8A, the temperature gradient between the surface 31b toward the space part 3a (designed as the "b" point) and the interface 31c (designed as the "c" point) between the carbon steel layer 8A and the covering layer 8B can be decreased, and also the temperature difference t1 in the carbon steel layer 8A in the circumferential wall 31 can be decreased, so that the temperature of the cooling medium can be increased.

If the circumferential wall 31 is made from stainless steel as conventional, in a process of heat transferring from the reactor 1 to the cooling medium, larger temperature difference between surfaces of the circumferential wall 31, facing the inner space 101 and the space part 3a, may occurred than in a case in which the circumferential wall 31 is made from carbon steel since the thermal conductivity of the stainless steel is low as about 16 W/(m·K). In this case, the temperature gradient between the "b" point and the "c" point is larger than in a case in which carbon steel is used, so that the temperature of the cooling medium must be lower than in a case in which carbon steel is used. Therefore, in the case in which the circumferential wall 31 is made from stainless steel, the heat is recovered at lower temperature than in the case in which the circumferential wall 31 is made from carbon steel.

In the apparatus 100 for producing polycrystalline silicon of the present embodiment, by using carbon steel having high thermal conductivity, the temperature difference in the circumferential wall 31 is decreased to a half or less than by stainless steel, the cooling medium can be used at higher temperature than using stainless steel.

Furthermore, by using boiling two-phase flow of water and steam for the cooling medium, the temperature difference (denoted as t2 in FIG. 4) between the temperature of the cooling medium at the space part 3a (designed as the "a" point) and the temperature of the surface 31b at the space part 3a side surface of the circumferential wall 31 (designed as the "b" point) can be decreased.

The heat transfer coefficient of single phase flow of water is about 1000 W/(m²·K). The heat transfer coefficient of boiling two-phase flow of water is about 4000 W/(m²·K) or more. The temperature difference between the main stream of water (steam) and outer surface of the circumferential wall 31 is decreased in accordance with increase of the heat transfer coefficient. Therefore, the temperature difference between the main stream temperature of water and the temperature at the outside of the circumferential wall 31 can be decreased to a quarter or less than the temperature difference using single phase flow.

As described above, both of the temperature difference t1 between the "b" and "c" points, and the temperature difference t2 between the "a" and "b" points can be decreased. Therefore, the inner surface temperature of the circumferential wall 31 can be suppressed not to be excessively high, and the cooling medium can be maintained at high temperature at the same time. As a result, it is compatible to maintain the inner surface temperature of the circumferential wall 31 to lower than the restrictive temperature which can prevent occurring of impurities, and to recover the cooling medium having temperature high enough to be reused efficiently.

As described above, by using boiling two-phase flow, the surface temperature of the circumferential wall 31 facing the inner space 101 of the reactor can be suppressed to lower than the restrictive temperature, and the temperature of the cooling medium can be maintained high. This makes it possible to recover exhaust heat from cooling medium that passes through the reactor 1 and obtain recovered heat at high temperature, which is reusable efficiently.

In a case in which boiling two-phase flow is used as the cooling medium, dry out may occur partially if the cooling medium does not flow uniformly in the space part 3a. If the dry out occurs, since the heat transfer coefficient is rapidly decreased, the temperature at the circumferential wall 31 of the reactor 1 is increased, so that the impurities may occur. However, in the apparatus 100 for producing polycrystalline silicon of the present embodiment, the space part 3a of the bell jar 3 is provided with: the coolant inlets 9 introducing the cooling medium from the lower part of the bell jar 3 with intervals along the circumference direction; the coolant outlet 10 discharging the cooling medium from the upper part of the bell jar 3; and partition plates 11 dividing the space part 3a to the plurality of cells along the circumferential direction. Therefore, the cooling medium can uniformly flow from the lower part toward the upper part of the bell jar 3, so that cooling medium depletion on the circumferential wall 31 in the space part 3a can be prevented.

In the apparatus 100 for producing polycrystalline silicon, a thickness of the circumferential wall 31 can be obtained from the mechanical strength and the thermal conductivity of the material constructing the circumferential wall 31 of the reactor 1 so as to recover the exhaust heat as steam from the cooling jacket (i.e., the cooling path 3a) and to keep the inner surface temperature of the circumferential wall 31 lower than the restrictive temperature. For example, the circumferential wall 31 thickness can be calculated in accordance with Formula (1).

For the circumferential wall of the reactor, the thermal conductivity of the material is $\lambda$(W/(m·K)), the thickness is L(m), the saturated water vapor pressure (gauge pressure) of boiling two-phase flow in the jacket is Psat (MPa), and the restrictive temperature which is a maximum temperature acceptable in the circumferential wall is $T_{in}$(° C.). The saturated water vapor pressure Psat is in a range of 0<Psat≤0.7 (MPa). The restrictive temperature $T_{in}$ in the circumferential wall varies with a degree of purity of polycrystalline silicon to be produced. For example, when producing fine polycrystalline silicon for semiconductor, in order to prevent the impurities from the circumferential wall, it is necessary to keep the restrictive temperature $T_{in}$ lower than when producing polycrystalline silicon for solar cells.

[FORMULA 1]

$$\frac{2.0 \times 10^{-5} \times T_{in} + 2.15 \times 10^{-3} \times Psat^2 - 3.4 \times 10^{-3} \times Psat - 2.05 \times 10^{-3}}{(L/\lambda) + 1.0 \times 10^{-4}} \geq 1.5 \quad (1)$$

Figure 5:
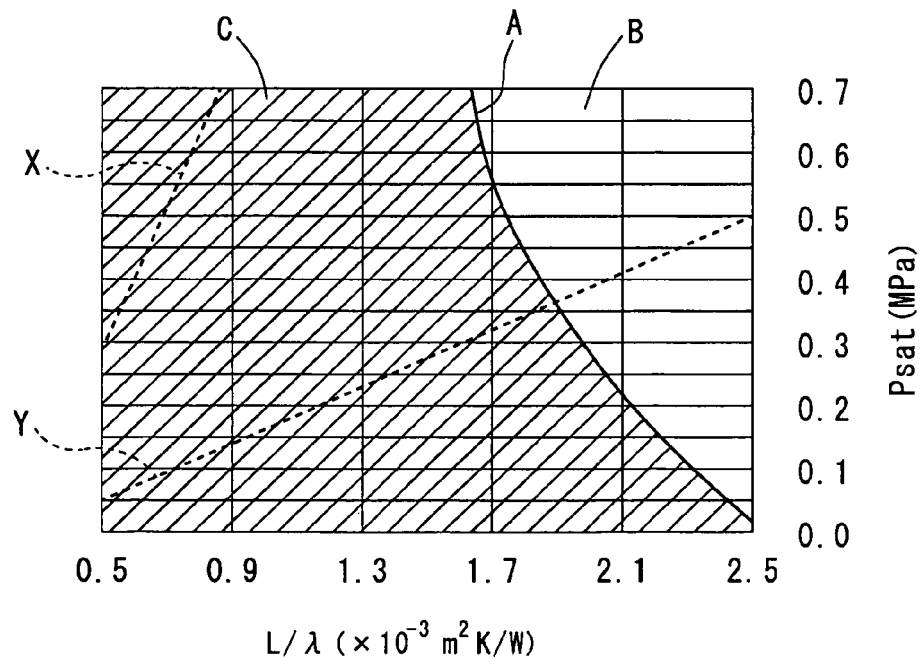
FIG. 5 is a graph showing a relationship between a circumferential wall of the reactor and vapor pressure in a jacket.

FIG. 5 and FIG. 6 show relationship between Formula (1) and three parameters of: the thermal conductivity λ of the material of the circumferential wall, the thickness L of the circumferential wall, and the saturated water vapor pressure in the jacket Psat when $T_{in}$ is 300° C., for example.

The curved line A in FIG. 5 and FIG. 6 denotes a condition implying that the left part of Formula (1)=1.5. On the curved line A, the inner surface temperature of the circumferential wall of the reactor is 300° C. An area B at the right side of the curved line A in FIG. 5 denotes a condition implying that the left part of Formula (1)<1.5. An area C at the left side of the curved line A in FIG. 5 denotes a condition implying that the left side of Formula (1)>1.5.

The area denoted by the curved line A and an area C is a combination satisfying a condition in which the inner surface temperature of the circumferential wall of the reactor is suppressed to lower than 300° C., and the heat can be recovered by steam at Psat.

The circumferential wall needs the thickness that can bear the pressure of boiling two-phase flow involving steam. However, the thickness varies with material, the figure and the size of structure. For example, since the mechanical strength of carbon steel is different from that of stainless steel, if the bell jar is formed to have the same figure, the thickness for necessary to bear the saturated water vapor pressure Psat is different from each other.

Figure 6A:
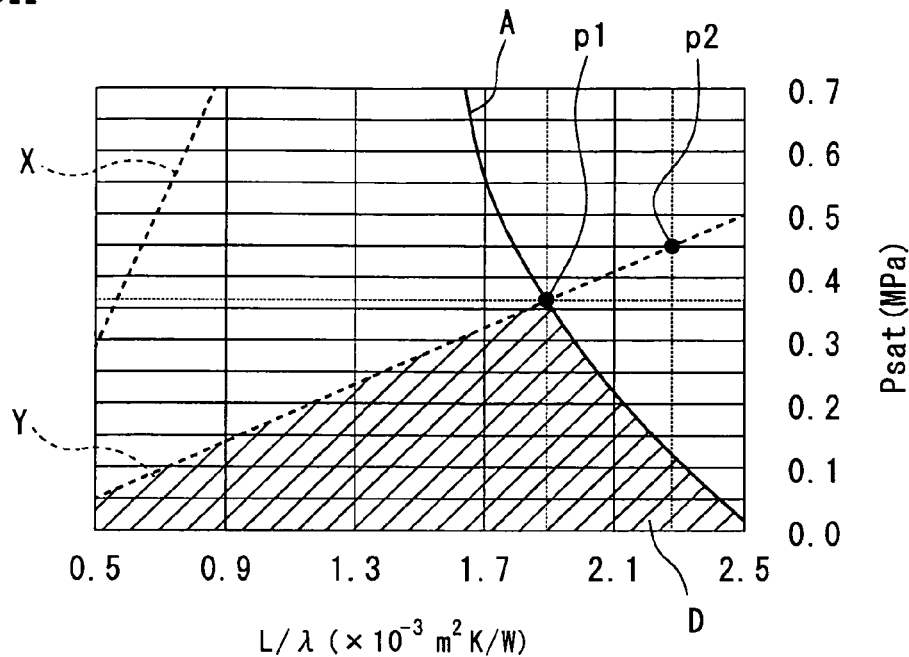
FIG. 6A is a graph showing a condition in a case in which stainless steel is used on the graph of FIG. 5.
Figure 6B:
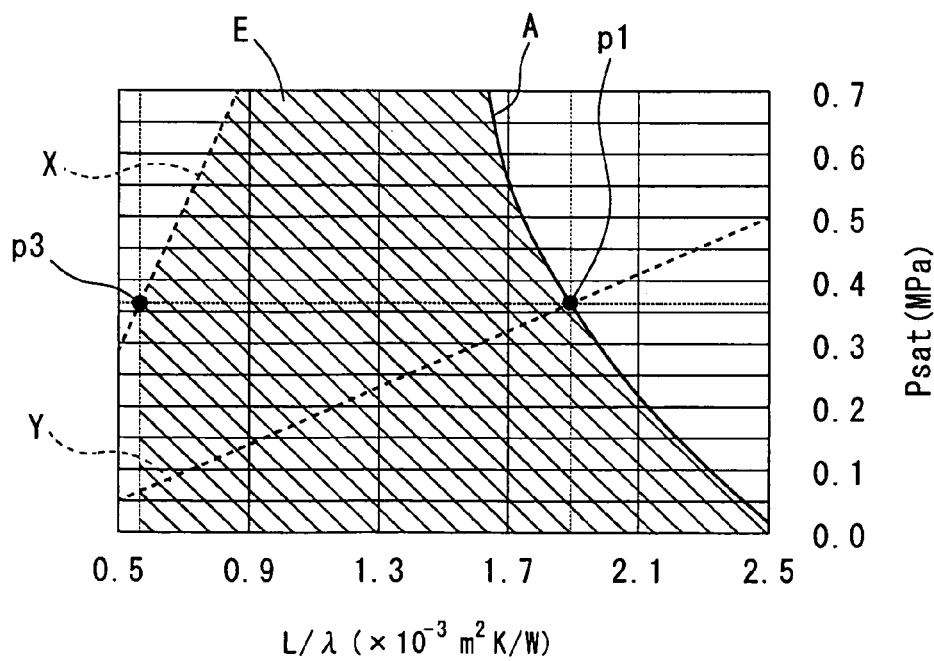
FIG. 6B is a graph showing a condition in a case in which carbon steel is used on the graph of FIG. 5.

In FIG. 5, FIGS. 6A and 6B, the broken lines X and Y denote relationship between the saturated water vapor pressure Psat and the necessary thickness L of the circumferential wall of the bell jar to bear saturated water vapor pressure Psat in accordance with the thermal conductivity λ of the material of the circumferential wall. The broken line X denotes a case in which the material of the circumferential wall is carbon steel; and the broken line Y denotes a case in which the material of the circumferential wall stainless steel.

In a case in which the bell jar is formed from stainless steel, an extent in which the temperature of the circumferential wall can be suppressed below 300° C. is on the curved line A and the area C that is the left of the curved line in FIG. 5 as above-mentioned. Further taking a parameter of the mechanical strength into account of this extent, the thickness L of the circumferential wall and the water vapor pressure P in which the bell jar of stainless steel satisfies the necessary conditions are denoted by the area D under the broken line Y in FIG. 6A. In this case, the maximum water vapor pressure (i.e., the saturated water vapor pressure Psat) allowable for the stainless steel-made circumferential wall is 0.36 MPa (designated as the point p1) in gauge pressure.

As described above, when the bell jar is made from stainless steel, obtainable water vapor pressure is 0.36 MPa (the point p1) at a maximum; and the inner surface temperature of the circumferential wall is 300° C. in this situation. Therefore, the thickness of the circumferential wall that can be derived from Formula (1) is 30 mm. In the condition of p2, though the thickness of the circumferential wall can withstand the water vapor pressure, the temperature of the inner surface of the circumferential wall exceeds 300° C. Therefore, this condition of p2 is not applicable.

On the other hand, when the bell jar is made from carbon steel, since carbon steel has the larger mechanical strength and the thermal conductivity than that those of stainless steel, extents of the thickness L and the water vapor pressure P of the circumferential wall which can satisfy the necessary conditions of the bell jar is broader than the area A by stainless steel, designated by an area E between the broken line X and the curved line A including the area D as shown in FIG. 6B. That is to say, since 0.7 MPa (in gauge pressure) of water vapor pressure is allowable for the circumferential wall made from carbon steel, it is possible to obtain the steam of higher temperature than the case of the circumferential wall made from stainless steel.

For example, the circumferential wall which can maintain the water vapor pressure at 0.36 MPa has, if it is made from carbon steel, a broader extent of the thickness L to be set than in a case in which the circumferential wall is made from stainless steel. The thickness L of the circumferential wall of carbon steel can be set to 20 mm (designated as the point p3) as the minimum; and the inner surface temperature of the circumferential wall can be set to about 200° C. which is drastically lower than 300° C. (designated as the point p1). As a result, the impurities from the circumferential wall to the inner of the reactor can be steadily prevented.

As described above, according to the apparatus 100 for producing polycrystalline silicon, it is possible to prevent contamination by the impurities for the polycrystalline silicon produced in a condition in which the inner surface temperature of the circumferential wall 31 of the reactor 1 is cooled below 300° C., and it is possible to obtain high temperature steam that is preferable state of recovered heat to be reused efficiently.

The present invention is not limited to the above-described embodiments and various modifications may be made without departing from the scope of the present invention. For example, in the above embodiment, the boiling two-phase flow in the cooling path is set to 0.15 MPa and 127° C. and so on. However, the pressure and the temperature of boiling two-phase flow is not limited as the above values, it can be set so that the inside of the reactor can be cooled appropriately, and the exhaust heat can be used efficiently.

It is preferable that the covering layer of the bell jar include one or of both a nickel layer and a stainless steel layer containing, by weight, 16 to 24% Cr, 8 to 15% Ni, and 0 to 5% Mo. For examples of stainless steel, SUS304L (18Cr—8Ni), SUS316L (18Cr—12Ni—2.5Mo), SUS317L (18Cr—12Ni—3.5Mo), SUS309S (22Cr—12Ni), SUS347 (18Cr—9Ni—Nb) are preferred. In a case in which the covering layer includes both the nickel layer and the stainless steel layer, it is preferable that the nickel layer be formed between the surface of the carbon steel and the stainless steel layer.

Resupplying part of the cooling medium from the coolant resupplying system which is set at the tank 42 in the above embodiment can be set at any part in which the cooling medium flows, i.e., the coolant feeding system, the coolant recovering system, the cooling path, or the like.

Figure 7:
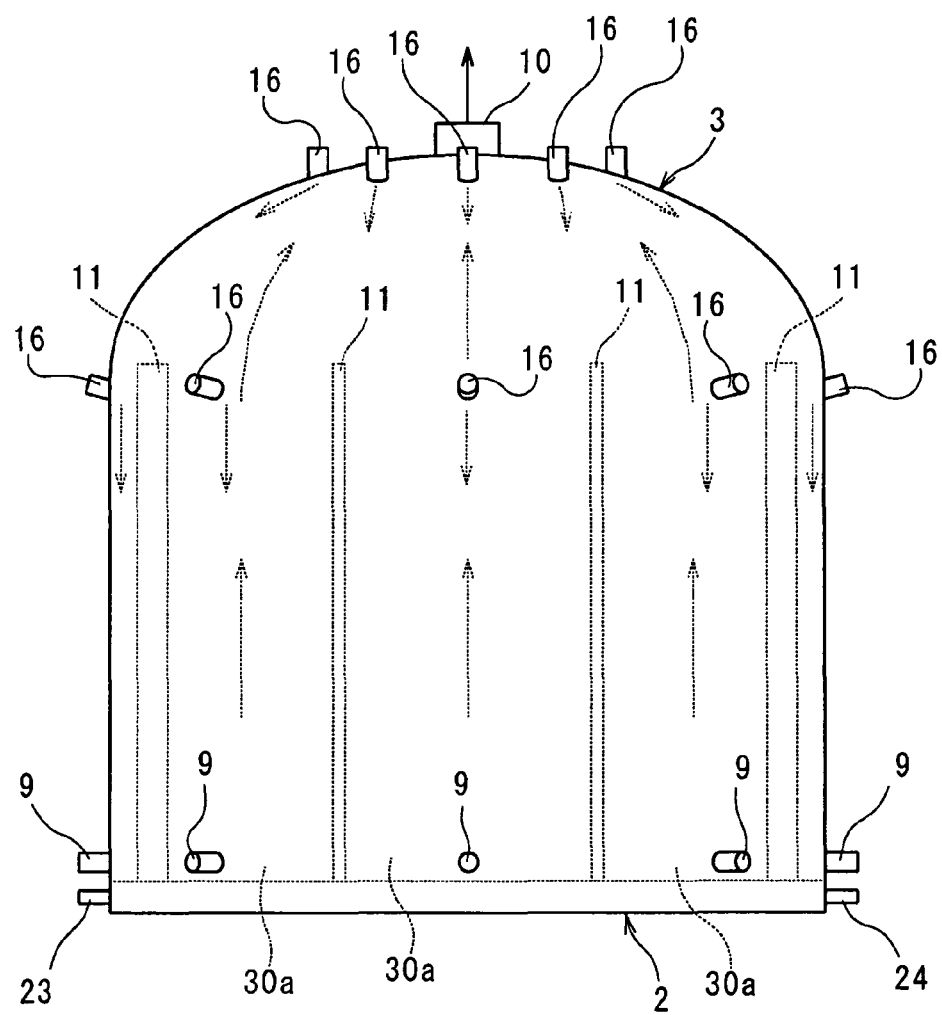
FIG. 7 is an external view showing a substantial part of the reactor according to another embodiment of the apparatus for producing polycrystalline silicon of the present invention.

The coolant inlets introducing the cooling medium into the cooling path of the bell jar are provided only at the lower part of the bell jar in the above embodiment. However, as shown in FIG. 7, a plurality of upper coolant inlets 16 introducing the cooling medium to the cooling path 3a may be additionally provided at the upper part of the jacket 32 with intervals along the circumferential direction in a case in which the heat transmission from the circumferential wall 31 is large; for example, when a large amount of silicon seed rods 4 are provided, or when producing the polycrystalline silicon rod R having a large diameter. In this case, as shown in FIG. 8, the cooling medium introduced from the coolant inlets 9 provided at the lower part of the jacket 32 flows upward; on the other hand, the cooling medium introduced from the upper coolant inlets 16 goes through the boiling two-phase flow, reaches to the surface of the circumferential wall 31, and flows downward along the surface of the circumferential wall 31, so that the circumferential wall 31 is cooled.

The heat flux from the reaction chamber 101 to the cooling medium through the circumferential wall 31 is not uniform by location; especially, the heat flux is large at the top of the reaction chamber 101. Also, in the cooling medium introduced from the lower part of the cooling path 3a, a volume ratio of vapor in the boiling two-phase flow is larger at the upper part of the cooling path 3a than at the lower part, so that dry out tends to occur at the upper part of the cooling path 3a. It is likely to happen especially when a large amount of silicon seed rods 4 are provided, or when producing the polycrystalline silicon rod R having a large diameter. Therefore, by introducing the cooling medium at the upper part of the cooling path 3a, the dry out can be effectively prevented.

Figure 8:
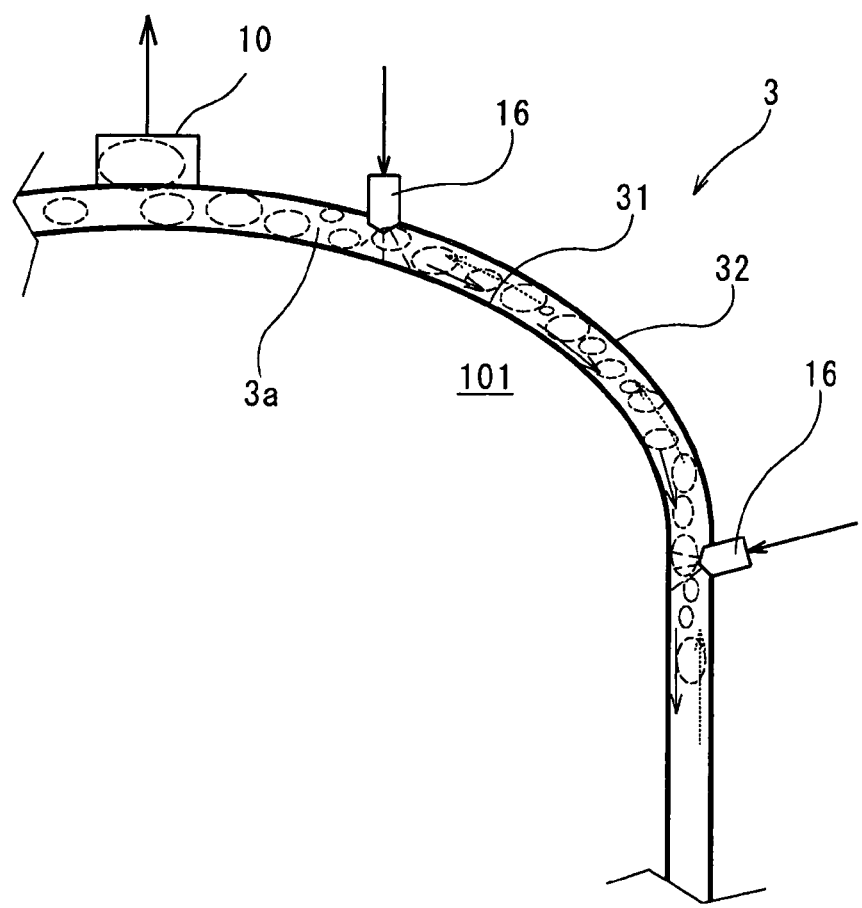
FIG. 8 is a partial cross sectional view showing a substantial part of the reactor of FIG. 7.

As shown in FIG. 8, it is preferable that the upper coolant inlets 16 be provided with a spray nozzle spraying the cooling medium in a fan-shape or a cone-shape. By using such the spray nozzle as above, the liquid cooling medium can be directly supplied on the surface of the circumferential wall 31 widely. It is more preferable that the nozzles be provided downwardly. By providing the nozzles downwardly, the cooling medium is helped to flow downwardly on the surface of the circumferential wall 31, the dry out can be prevented in further wide area.

The cooling medium supplied from the upper coolant inlets 16 may be the same water as the cooling medium introduced from the lower coolant inlets 9, such as condensed cooling medium after recovered heat is removed by an external equipment (not illustrated). By using newly resupplied cooling medium; in other words, the cooling medium having lower temperature than the cooling medium supplied from the coolant inlets 9, a higher cooling effect can be obtained.

What is claimed is:

1. An apparatus for producing polycrystalline silicon in which raw gas including silicon compounds is introduced into a reactor, in which electric current is supplied to silicon seed rods in the reactor so as to heat the silicon seed rods, and in which polycrystalline silicon is deposited on surfaces of the silicon seed rods and grown to rods, the apparatus comprising:
 a bell jar having a circumferential wall forming a chamber of the reactor and a jacket covering the circumferential wall, and in which a cooling path formed between the circumferential wall and the jacket that allows a cooling medium including water to flow therethrough;
 a coolant feeding system which is connected to the bell jar so as to feed the cooling medium to the cooling path;
 a coolant recovering system which is connected to the bell jar so as to recover the cooling medium from the cooling path;
 a pressure control part controlling a pressure in the cooling path; and
 a flow-rate control part controlling a flow rate of the cooling medium
 wherein by maintaining the pressure in the cooling path to a prescribed high pressure and introducing the cooling medium into the cooling path in a state of liquid of nearly saturated temperature, the cooling medium flows as a boiling two-phase flow having a heat transfer coefficient larger than that of a single-phase flow of water, so that the circumferential wall is cooled by the boiling two-phase flow of the cooling medium,
 wherein the circumferential wall is made of carbon steel having thermal conductivity of 35 W/(m·K) or more,
 wherein the coolant feeding system is connected to a plurality of coolant inlets that are provided on a lower part of the jacket with intervals along a circumferential direction so as to introduce the cooling medium to the cooling path, and connected to a plurality of upper coolant inlets that are provided on an upper part of the jacket with intervals along the circumferential direction so as to introduce the cooling medium to the cooling path, and
 wherein the coolant recovering system is connected to a coolant outlet that is provided on an upper part of the jacket so as to discharge the cooling medium from the cooling path.

2. The apparatus for producing polycrystalline silicon according to claim 1 further comprising a tank being connected to an upstream of the coolant feeding system and a downstream of the coolant recovering system,
 wherein the cooling medium being recovered from the cooling path through the recovering system is separated into steam and liquid in the tank, and wherein
 the separated liquid of the cooling medium is fed to the coolant feeding system from the tank.

3. The apparatus for producing polycrystalline silicon according to claim 2, wherein the tank is provided at a position in which a liquid level in the tank to be higher than a top of the bell jar.

4. The apparatus for producing polycrystalline silicon according to claim 2, further comprising:
 a pressure meter measuring an inner pressure of the tank;
 a supply system of steam having a steam-supply passage connected to the tank and a steam-supply valve which opens and closes the steam-supply passage, which draws out the steam in the tank; and
 a resupply system of the cooling medium which resupplies the liquid of the cooling medium to the tank,
 wherein the pressure meter and the supply system of steam construct the pressure control part.

5. The apparatus for producing polycrystalline silicon according to claim 1, further comprising partition plates that are provided between the circumferential wall and the jacket so as to divide at least a lower part of the cooling path to a plurality of cells along the circumferential direction, wherein the coolant inlets are connected to be communicated with the cells.

6. The apparatus for producing polycrystalline silicon according to claim 1, wherein
 the circumferential wall is formed from carbon steel having thermal conductivity of 35 W/(m·K) or more, and has a covering layer on an inner surface, and
 the covering layer includes one of or both a nickel layer and a stainless steel layer containing, by weight, 16 to 24% Cr, 8 to 15% Ni, and 0 to 5% Mo.

7. The apparatus for producing polycrystalline silicon according to claim 1, wherein the flow-rate control part controls the flow rate of the cooling medium so that a weight ratio of steam in the boiling two-phase flow at a coolant outlet of the cooling path is 0.5% to 20% at maximum.

* * * * *